(12) United States Patent
Shimomura

(10) Patent No.: US 10,847,646 B2
(45) Date of Patent: Nov. 24, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Saya Shimomura, Komatsu (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/277,101

(22) Filed: Feb. 15, 2019

(65) Prior Publication Data
US 2020/0091333 A1 Mar. 19, 2020

(30) Foreign Application Priority Data
Sep. 14, 2018 (JP) ................. 2018-172380

(51) Int. Cl.
*H01L 29/78* (2006.01)
*H01L 29/739* (2006.01)
(Continued)

(52) U.S. Cl.
CPC ...... *H01L 29/7802* (2013.01); *H01L 29/0865* (2013.01); *H01L 29/1095* (2013.01);
(Continued)

(58) Field of Classification Search
CPC ............. H01L 29/7802; H01L 29/0865; H01L 29/1095; H01L 29/41741; H01L 29/42356;
(Continued)

(56) References Cited

U.S. PATENT DOCUMENTS 7,385,248 B2 6/2008 Herrick et al.
8,502,305 B2 8/2013 Ohta et al.
(Continued)

FOREIGN PATENT DOCUMENTS

JP 5661583 1/2015
JP 5774921 9/2015
(Continued)

*Primary Examiner* — Timor Karimy
(74) *Attorney, Agent, or Firm* — Oblon, McClelland, Maier & Neustadt, L.L.P.

(57) ABSTRACT

According to one embodiment, a semiconductor device includes a first electrode, a first semiconductor region, a second semiconductor region, a third semiconductor region, a conductive portion, a gate electrode, and a second electrode. The second semiconductor region is provided on the first semiconductor region. The third semiconductor region is provided selectively on the second semiconductor region. The conductive portion is provided inside the first semiconductor region. The gate electrode is separated from the conductive portion in a first direction. The gate electrode includes a first portion and a second portion. The first portion is provided on the conductive portion. A lower surface of the first portion is positioned higher than a lower end of an interface between the second semiconductor region and the third semiconductor region. The second portion opposes the first semiconductor region, the second semiconductor region, and the third semiconductor region in a second direction.

7 Claims, 13 Drawing Sheets

(51) Int. Cl.
　　　　*H01L 29/66*　　　　(2006.01)
　　　　*H01L 29/10*　　　　(2006.01)
　　　　*H01L 29/423*　　　(2006.01)
　　　　*H01L 29/08*　　　　(2006.01)
　　　　*H01L 29/417*　　　(2006.01)

(52) U.S. Cl.
　　　　CPC .. *H01L 29/41741* (2013.01); *H01L 29/42356* (2013.01); *H01L 29/66712* (2013.01); *H01L 29/7395* (2013.01)

(58) Field of Classification Search
　　　　CPC ........... H01L 29/66712; H01L 29/7395; H01L 29/78; H01L 29/739; H01L 29/66; H01L 29/10; H01L 29/423; H01L 29/08; H01L 29/417
　　　　See application file for complete search history.

(56) References Cited

U.S. PATENT DOCUMENTS

| | | |
|---|---|---|
| 8,803,207 B2 | 8/2014 | Grebs et al. |
| 8,829,604 B2 | 9/2014 | Okaji |
| 2018/0083110 A1 | 3/2018 | Kobayashi et al. |

FOREIGN PATENT DOCUMENTS

| | | |
|---|---|---|
| JP | 2015-222817 | 12/2015 |
| JP | 2018-046253 | 3/2018 |

SEMICONDUCTOR DEVICE

CROSS-REFERENCE TO RELATED APPLICATIONS

This application is based upon and claims the benefit of priority from Japanese Patent Application No. 2018-172380, filed on Sep. 14, 2018; the entire contents of which are incorporated herein by reference.

FIELD

Embodiments described herein relate generally to a semiconductor device.

BACKGROUND

Semiconductor devices such as MOSFETs (Metal Oxide Semiconductor Field Effect Transistors), IGBTs (Insulated Gate Bipolar Transistors), and the like are used in power conversion, etc. It is desirable for the semiconductor devices to have a small resistance in the ON-state (the ON-resistance).

DETAILED DESCRIPTION

Figure 1:
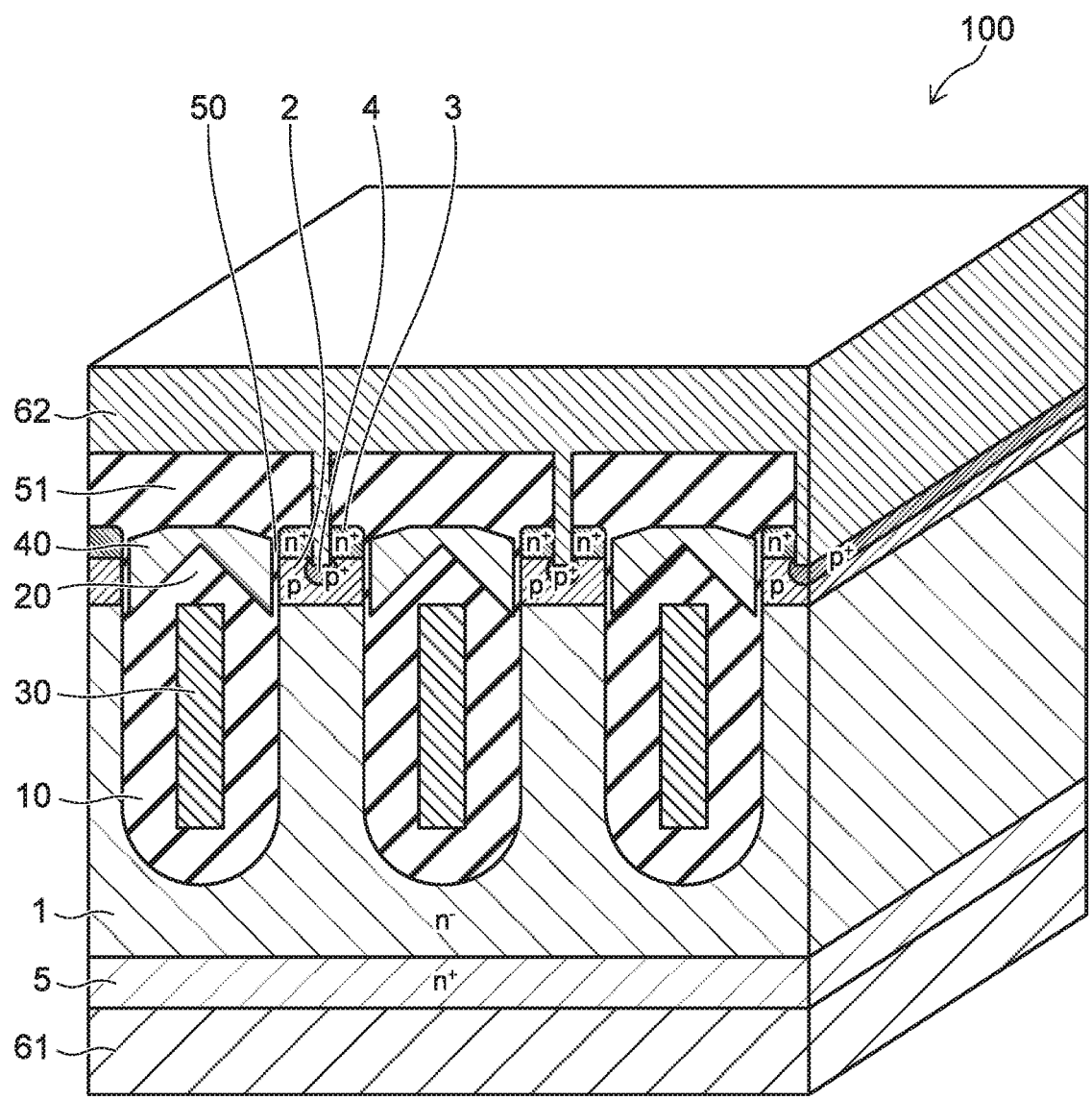
FIG. 1 is a perspective cross-sectional view illustrating a semiconductor device according to a first embodiment.

According to one embodiment, a semiconductor device includes a first electrode, a first semiconductor region, a second semiconductor region, a third semiconductor region, a conductive portion, a gate electrode, and a second electrode. The first semiconductor region is provided on the first electrode. The first semiconductor region is of a first conductivity type. The first semiconductor region is electrically connected to the first electrode. The second semiconductor region is provided on the first semiconductor region. The second semiconductor region is of a second conductivity type. The third semiconductor region is provided selectively on the second semiconductor region. The third semiconductor region is of the first conductivity type. The conductive portion is provided inside the first semiconductor region with a first insulating portion interposed. The gate electrode is separated from the conductive portion in a first direction. The first direction is from the first electrode toward the first semiconductor region. The gate electrode includes a first portion and a second portion. The first portion is provided on the conductive portion with a second insulating portion interposed. A lower surface of the first portion is positioned higher than a lower end of an interface between the second semiconductor region and the third semiconductor region. The second portion opposes, with a gate insulating portion interposed, the first semiconductor region, the second semiconductor region, and the third semiconductor region in a second direction perpendicular to the first direction. A position in the second direction of the second portion is between a position in the second direction of the first portion and a position in the second direction of the second semiconductor region. The second electrode is provided on the second semiconductor region and the third semiconductor region. The second electrode is electrically connected to the conductive portion, the second semiconductor region, and the third semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n$, $n^-$ and $p^+$, $p$, $p^-$ represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

FIG. 1 is a perspective cross-sectional view illustrating a semiconductor device according to a first embodiment.

The semiconductor device 100 according to the first embodiment illustrated in FIG. 1 is a MOSFET. The semiconductor device 100 according to the first embodiment includes an $n^-$-type (first conductivity type) drift region 1 (first semiconductor region), a p-type (second conductivity type) base region 2 (second semiconductor region), an $n^+$-type source region 3 (a third semiconductor region), a $p^+$-type contact region 4, an $n^+$-type drain region 5, an insulating portion 10 (a first insulating portion), an insulating portion 20 (a second insulating portion), a conductive portion 30, a gate electrode 40, a gate insulating portion 50, an insulating portion 51, a drain electrode 61 (a first electrode), and a source electrode 62 (a second electrode).

An XYZ orthogonal coordinate system is used in the description of the embodiments. A direction from the drain electrode 61 toward the $n^-$-type drift region 1 is taken as a Z-direction (a first direction). Two mutually-orthogonal directions perpendicular to the Z-direction are taken as an X-direction (a second direction) and a Y-direction.

The drain electrode 61 is provided at the lower surface of the semiconductor device 100. The n$^+$-type drain region 5 is provided on the drain electrode 61 and electrically connected to the drain electrode 61. The n$^-$-type drift region 1 is provided on the n$^+$-type drain region 5. The n$^-$-type drift region 1 is electrically connected to the drain electrode 61 via the n$^+$-type drain region 5. The p-type base region 2 is provided on the n$^-$-type drift region 1. The n$^+$-type source region 3 and the p$^+$-type contact region 4 are provided selectively on the p-type base region 2.

The conductive portion 30 is provided inside the n$^-$-type drift region 1 with the insulating portion 10 interposed. The gate electrode 40 is provided on the conductive portion 30 and is separated from the conductive portion 30. A specific structure of the gate electrode 40 is described below.

The source electrode 62 is provided on the n$^+$-type source region 3 and the p$^+$-type contact region 4 and electrically connected to the conductive portion 30, the n$^+$-type source region 3, and the p$^+$-type contact region 4. The insulating portion 51 is provided between the gate electrode 40 and the source electrode 62; and these electrodes are electrically separated.

For example, the p-type base region 2, the n$^+$-type source region 3, the p$^+$-type contact region 4, the conductive portion 30, and the gate electrode 40 are multiply provided in the X-direction and extend in the Y-direction.

The structure of the gate electrode 40 will now be described in detail with reference to FIG. 2.

Figure 2:
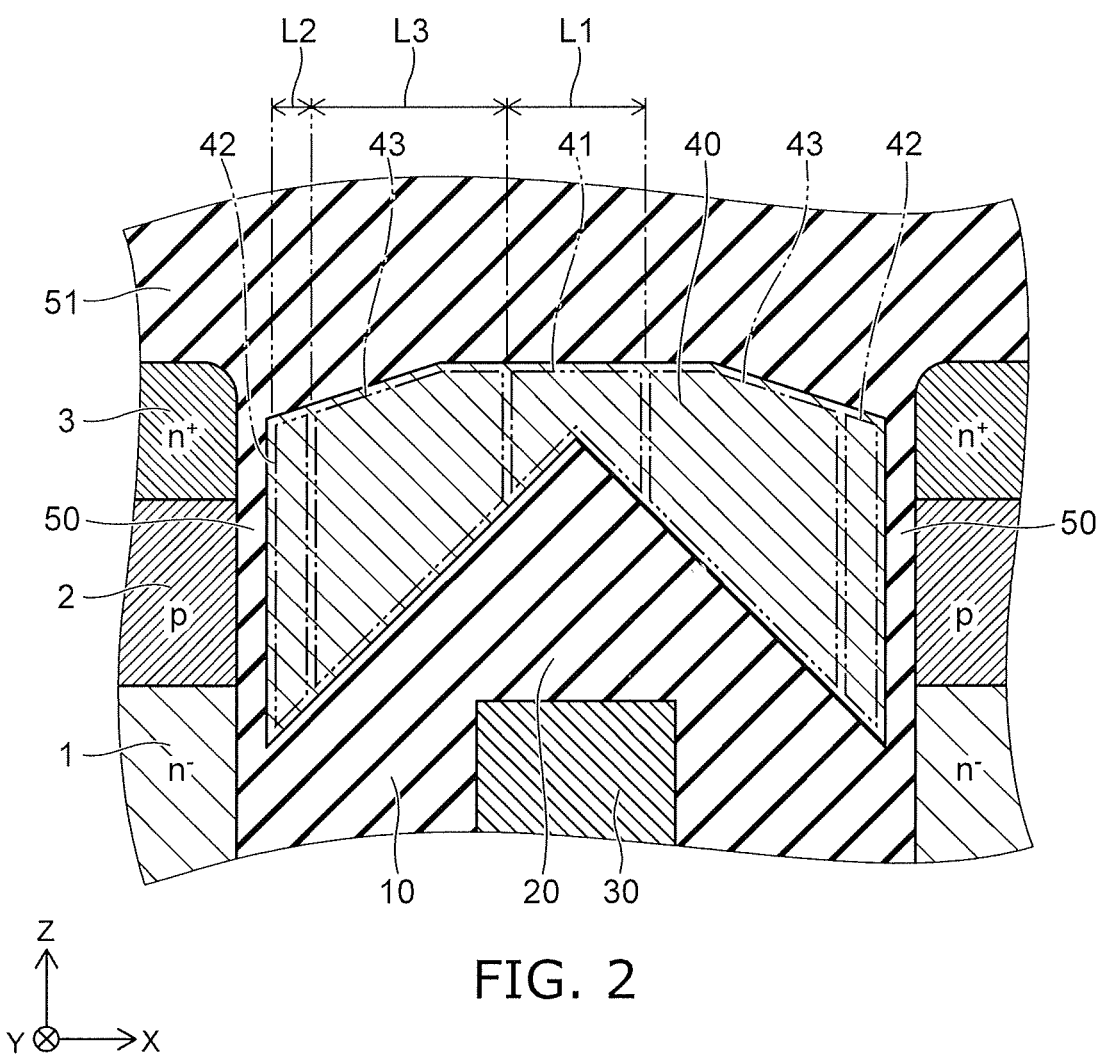
FIG. 2 is a cross-sectional view illustrating a portion of the semiconductor device according to the first embodiment.

FIG. 2 is a cross-sectional view illustrating a portion of the semiconductor device according to the first embodiment.

As illustrated in FIG. 2, the gate electrode 40 includes a first portion 41, a second portion 42, and a third portion 43.

The first portion 41 is provided on the conductive portion 30 with the insulating portion 20 interposed. The lower surface of the first portion 41 is positioned higher than the interface between the p-type base region 2 and the n$^+$-type source region 3. In the case where the position in the Z-direction of the interface between the p-type base region 2 and the n$^+$-type source region 3 is different by location, the lower surface of the first portion 41 is positioned higher than the deepest portion (the lower end) of the interface.

The second portion 42 opposes the n$^-$-type drift region 1, the p-type base region 2, and the n$^+$-type source region 3 in the X-direction with the gate insulating portion 50 interposed. In other words, the lower surface of the second portion 42 is positioned lower than the interface between the n$^-$-type drift region 1 and the p-type base region 2. In the case where the position in the Z-direction of the interface between the n$^-$-type drift region 1 and the p-type base region 2 is different by location, it is sufficient for the lower surface of the second portion 42 to be positioned lower than a portion of the interface contacting the gate insulating portion 50. The position in the X-direction of the second portion 42 is between the position in the X-direction of the first portion 41 and the position in the X-direction of the p-type base region 2.

The position in the X-direction of the third portion 43 is between the position in the X-direction of the first portion 41 and the position in the X-direction of the second portion 42. The lower surface of the third portion 43 is positioned higher than the interface between the n$^-$-type drift region 1 and the p-type base region 2 and positioned lower than the lower end of the interface between the p-type base region 2 and the n$^+$-type source region 3.

Operations of the semiconductor device 100 will now be described.

A voltage that is a threshold or more is applied to the gate electrode 40 in a state in which a voltage that is positive with respect to the source electrode 62 is applied to the drain electrode 61. Thereby, a channel (an inversion layer) is formed in the region of the p-type base region 2 at the gate insulating portion 50 vicinity; and the semiconductor device 100 is set to the ON-state. Electrons pass through the channel and flow from the source electrode 62 to the drain electrode 61. Subsequently, when the voltage applied to the gate electrode 40 becomes lower than the threshold, the channel in the p-type base region 2 disappears; and the semiconductor device 100 is set to the OFF-state.

When the semiconductor device 100 is switched to the OFF-state, the voltage that is positive with respect to the source electrode 62 and is applied to the drain electrode 61 increases. A depletion layer spreads toward the n$^-$-type drift region 1 from the interface between the insulating portion 10 and the n$^-$-type drift region 1. The breakdown voltage of the semiconductor device 100 can be increased by the spreading of the depletion layer. Or, the n-type impurity concentration of the n$^-$-type drift region 1 can be increased; and the ON-resistance of the semiconductor device 100 can be reduced while maintaining the breakdown voltage of the semiconductor device 100.

Examples of the materials of the components of the semiconductor device 100 will now be described.

The n$^-$-type drift region 1, the p-type base region 2, the n$^+$-type source region 3, the p$^+$-type contact region 4, and the n$^+$-type drain region 5 include silicon, silicon carbide, gallium nitride, or gallium arsenide as the semiconductor material. In the case where silicon is used as the semiconductor material, arsenic, phosphorus, or antimony can be used as the n-type impurity. Boron can be used as the p-type impurity.

The conductive portion 30 and the gate electrode 40 include a conductive material such as polysilicon, etc. An impurity may be added to the conductive material.

The insulating portion 10, the insulating portion 20, the gate insulating portion 50, and the insulating portion 51 include an insulating material such as silicon oxide, etc. The insulating portion 20 may include an impurity such as phosphorus, boron, etc. The insulating portion 10 may or may not include an impurity. For example, the concentration of boron in the insulating portion 20 is higher than the concentration of boron in the insulating portion 10 and higher than the concentration of boron in the gate insulating portion 50.

The drain electrode 61 and the source electrode 62 include a metal such as aluminum, etc.

An example of a method for manufacturing the semiconductor device 100 according to the first embodiment will now be described with reference to FIG. 3A to FIG. 6B.

FIG. 3A to FIG. 6B are process cross-sectional views illustrating the method for manufacturing the semiconductor device according to the first embodiment.

Figure 3A:
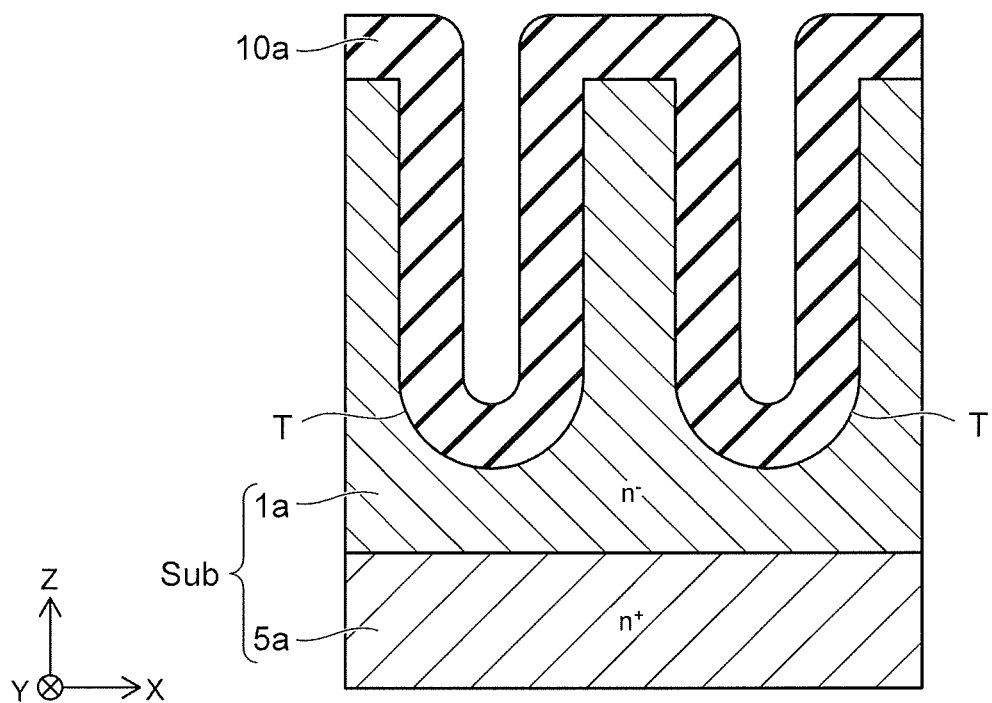
FIG. 3A to FIG. 6B are process cross-sectional views illustrating the method for manufacturing the semiconductor device according to the first embodiment.

A semiconductor substrate Sub is prepared. The semiconductor substrate Sub includes an n$^+$-type semiconductor region 5a, and an n$^-$-type semiconductor region 1a provided on the n$^+$-type semiconductor region 5a. Multiple trenches T that extend in the Y-direction are formed in the upper surface of the n$^-$-type semiconductor region 1a. As illustrated in FIG. 3A, an insulating layer 10a is formed along the upper surface of the n$^-$-type semiconductor region 1a and the inner surfaces of the trenches T. The insulating layer 10a is formed by thermal oxidation of the semiconductor substrate Sub. Or, the insulating layer 10a may be formed by depositing an insulating material (e.g., silicon oxide) along the upper surface of the n⁻-type semiconductor region 1a and the inner surfaces of the trenches T by CVD (Chemical Vapor Deposition).

Figure 3B:
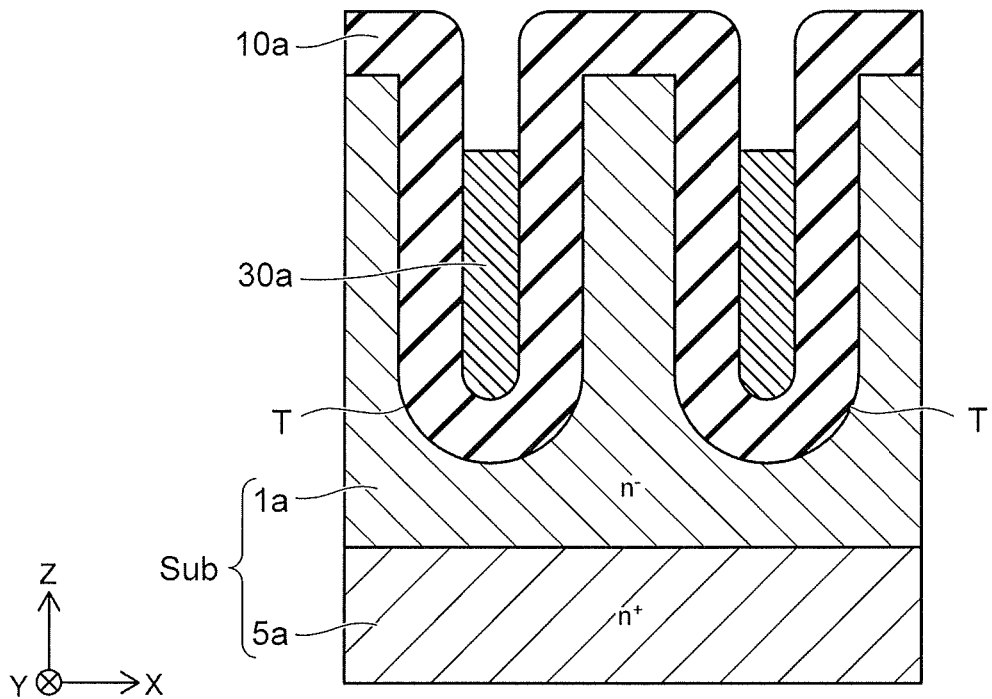

A conductive layer that fills the trenches T is formed on the insulating layer 10a. The conductive layer is formed by CVD of a conductive material such as polysilicon, etc. A portion of the conductive layer is removed by CDE (Chemical Dry Etching) or the like; and the upper surface of the conductive layer is recessed. Thereby, as illustrated in FIG. 3B, multiple conductive layers 30a that are provided to be separated from each other are formed inside the multiple trenches T.

Figure 4A:
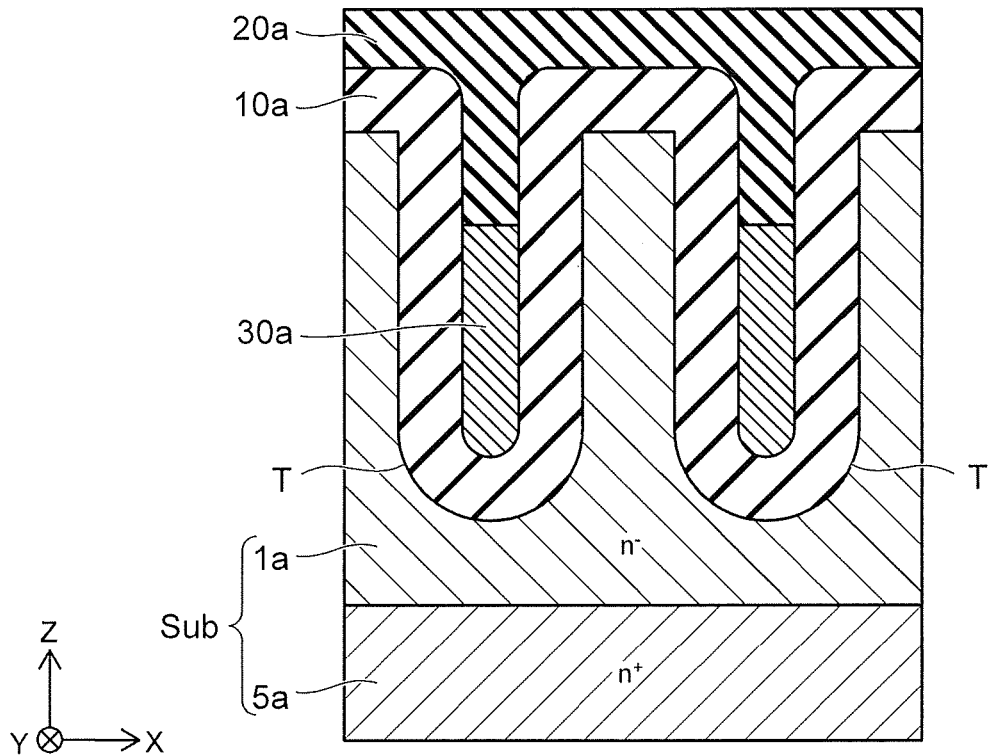

As illustrated in FIG. 4A, an insulating layer 20a is formed on the insulating layer 10a and the multiple conductive layers 30a. The insulating layer 20a is formed by forming a BPSG (Boro-Phospho Silicate Glass) film by CVD and by subsequently annealing the BPSG film. Therefore, the concentration of the impurity of the insulating layer 20a is higher than the concentration of the impurity of the insulating layer 10a.

Figure 4B:
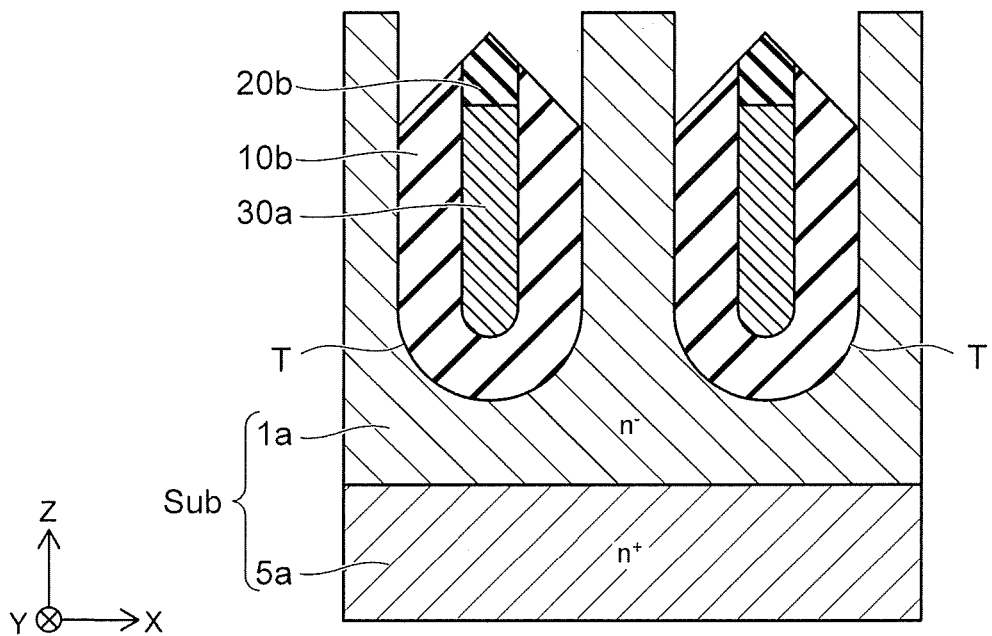

A portion of the insulating layer 10a and a portion of the insulating layer 20a are removed by wet etching. As illustrated in FIG. 4B, multiple insulating layers 10b and multiple insulating layers 20b that are provided to be separated from each other are formed inside the multiple trenches T.

The chemical liquid of the wet etching is selected so that the etching rate of the insulating layer 10a is larger than the etching rate of the insulating layer 20a. For example, the insulating layer 10a and the insulating layer 20a include silicon oxide; the insulating layer 10a is formed by thermal oxidation; and the concentration of boron in the insulating layer 20a is higher than the concentration of boron in the insulating layer 10a. In such a case, a mixed liquid of ammonium hydrogen fluoride ($NH_4HF_2$) and acetic acid ($CH_3COOH$) is used as the chemical liquid. Or, the insulating layer 10a and the insulating layer 20a include silicon oxide; the insulating layer 10a is formed by CVD; and the concentration of boron in the insulating layer 20a is higher than the concentration of boron in the insulating layer 10a. In such a case, a mixed liquid of dilute hydrofluoric acid (HF) and ammonium fluoride ($NH_4F$) is used as the chemical liquid. As a result, as illustrated in FIG. 4B, the insulating layers 10b and the insulating layers 20b are formed so that the upper surfaces are tilted with respect to the X-direction and the Z-direction.

A portion of the front surface of the n⁻-type semiconductor region 1a and a portion of the side walls of the trenches T are exposed by removing the portion of the insulating layer 10a and the portion of the insulating layer 20a. An insulating layer 50a is formed on the exposed surfaces of the n⁻-type semiconductor region 1a by thermal oxidation of the semiconductor substrate Sub. The thickness of the insulating layer 50a is thinner than the thickness of the insulating layers 10b.

Figure 5A:
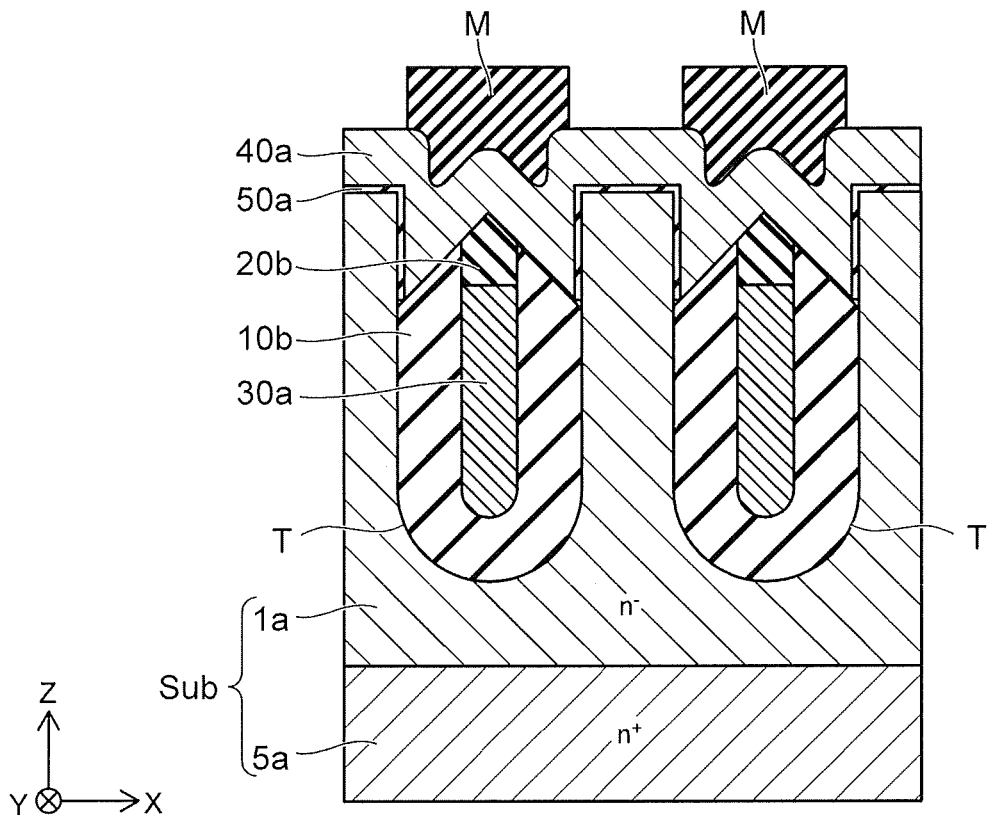

A conductive layer 40a is formed on the insulating layer 50a. As illustrated in FIG. 5A, multiple masks M are formed on the conductive layer 40a. The multiple masks M are positioned respectively on the multiple conductive layers 30a and the multiple insulating layers 20b. The masks M are formed by forming a photoresist on the conductive layer 40a and by patterning the photoresist.

Figure 5B:
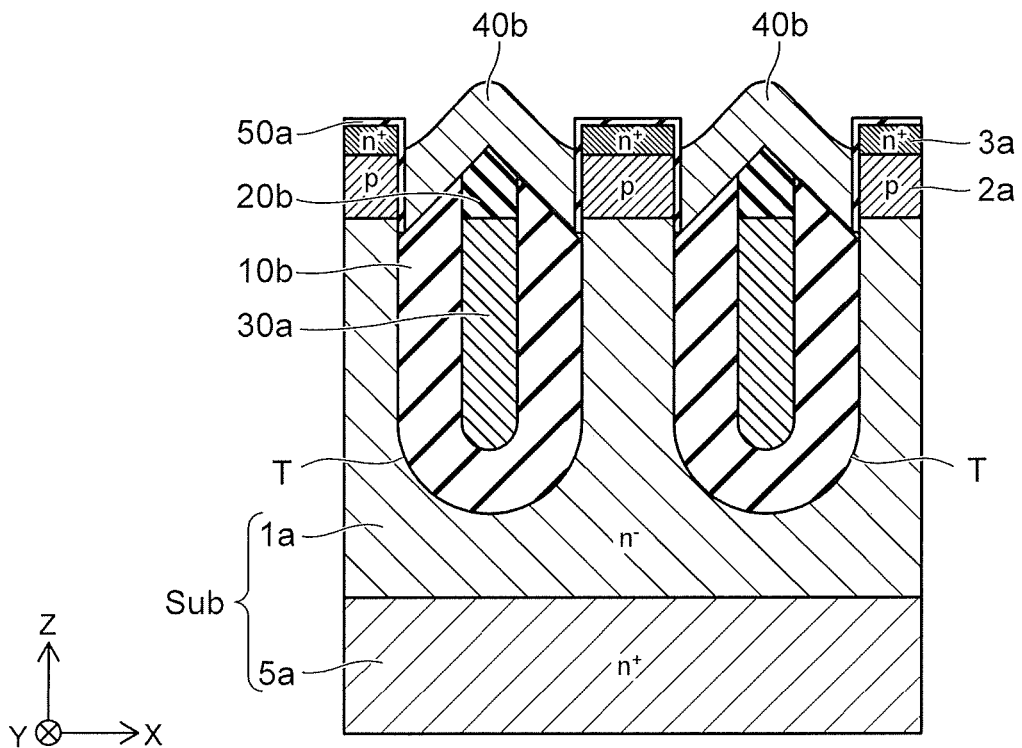

A portion of the conductive layer 40a is removed by CDE or wet etching using the masks M. Multiple conductive layers 40b that are provided to be separated from each other are formed on the multiple conductive layers 30a. After removing the masks M, p-type semiconductor regions 2a and n⁺-type semiconductor regions 3a are formed as illustrated in FIG. 5B by sequentially ion-implanting a p-type impurity and an n-type impurity into the upper portion of the n⁻-type semiconductor region 1a between the trenches T.

Figure 6A:
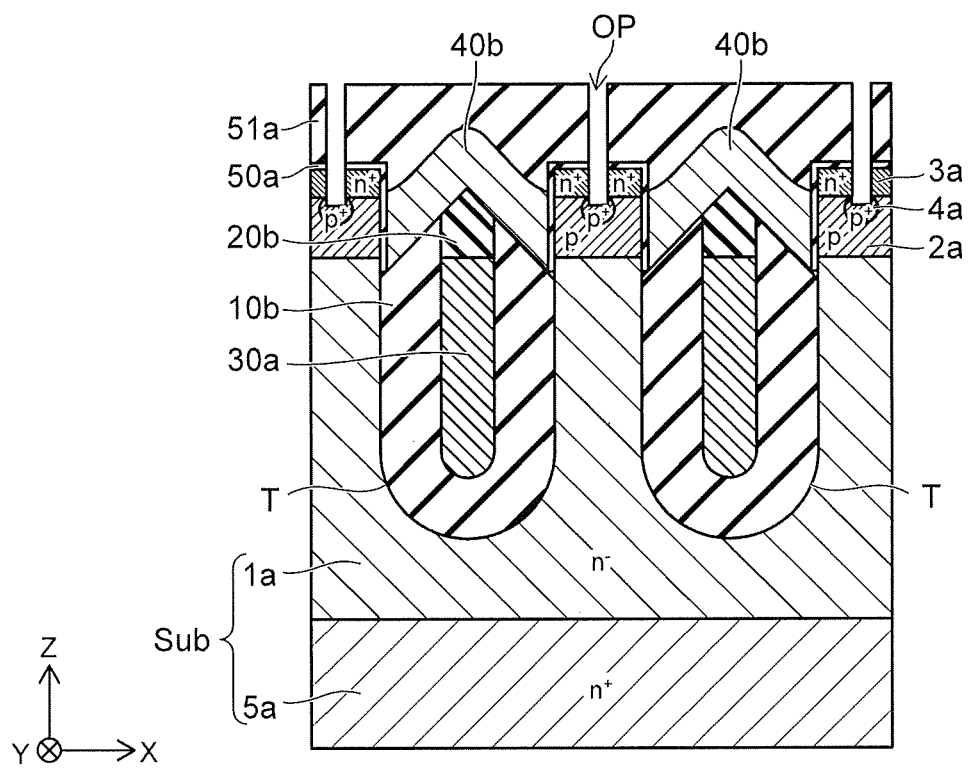

An insulating layer 51a that covers the multiple conductive layers 40b is formed. A part of the insulating layer 50a and a part of the insulating layer 51a are removed. Thereby, openings OP are formed. In this example, a part of each n⁺-type semiconductor regions 3a and a part of each p-type semiconductor regions 2a are further removed to form the openings OP. The openings OP respectively reach the p-type semiconductor regions 2a through the n⁺-type semiconductor regions 3a. A p-type impurity is ion-implanted into the p-type semiconductor region 2a through the openings OP; and p⁺-type semiconductor regions 4a are formed as illustrated in FIG. 6A.

Figure 6B:
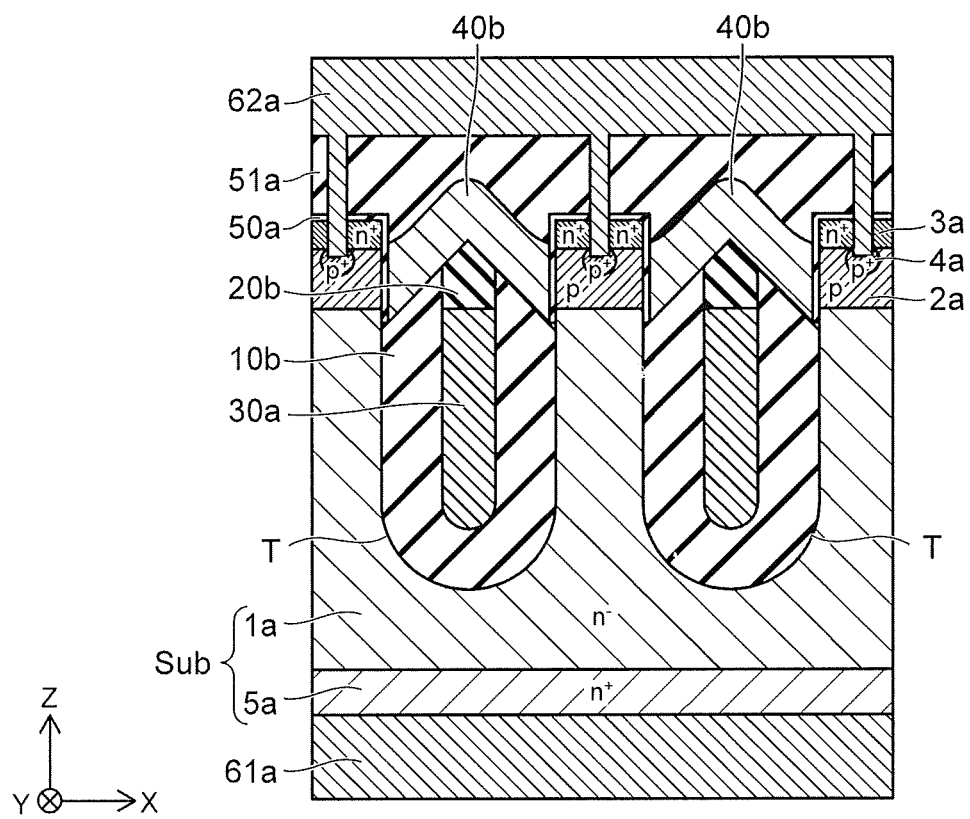

A metal layer 62a that fills the openings OP is formed on the insulating layer 51a. The lower surface of the semiconductor substrate Sub is polished until the n⁺-type semiconductor region 5a has a prescribed thickness. As illustrated in FIG. 6B, a metal layer 61a is formed on the polished lower surface. The semiconductor device 100 illustrated in FIG. 1 is manufactured by the processes recited above.

Figure 7B:
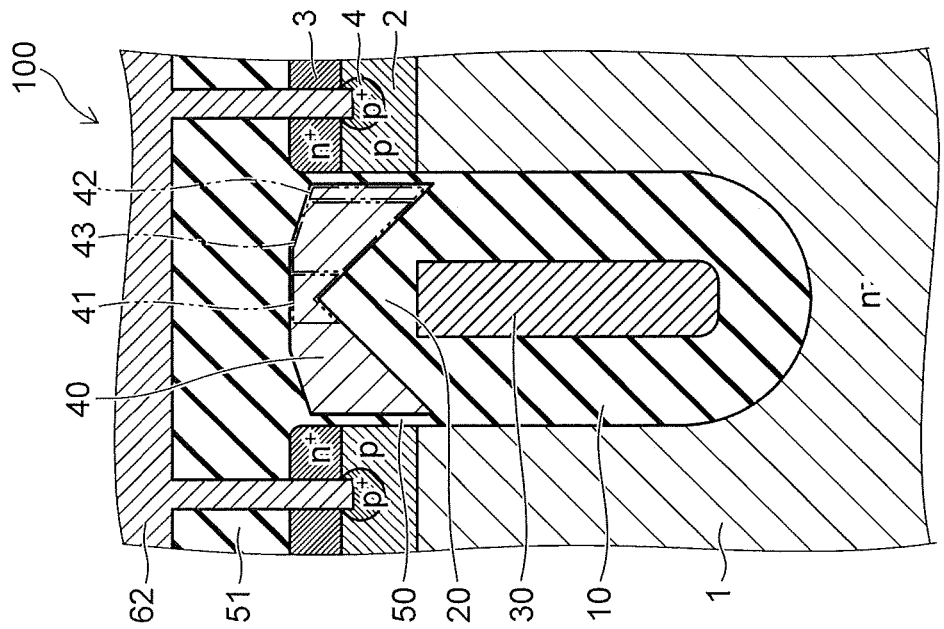
FIG. 7B is a cross-sectional view illustrating a portion of the semiconductor device according to the first embodiment.

Effects of the first embodiment will now be described with reference to FIG. 7A and FIG. 7B.

Figure 7A:
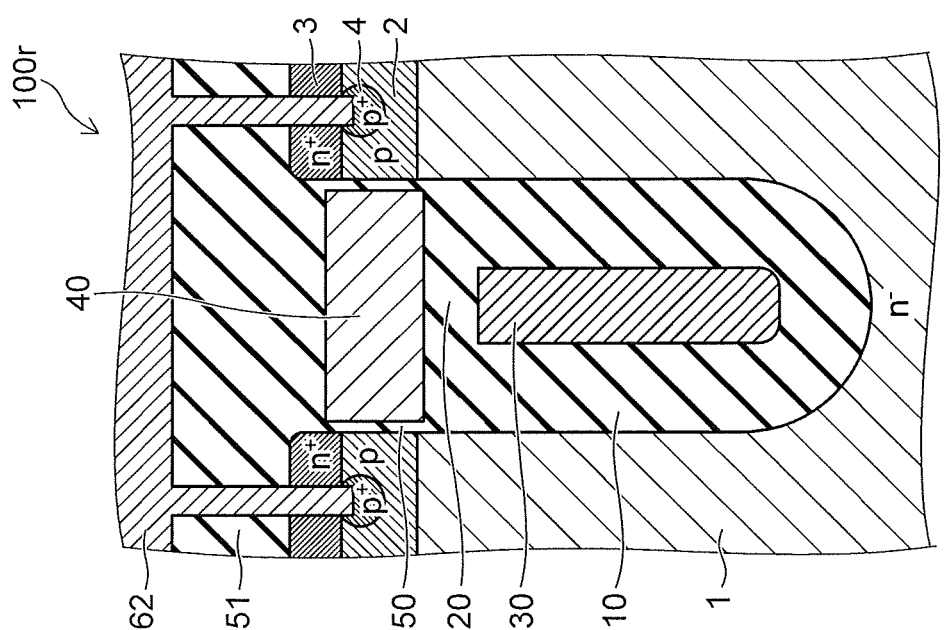
FIG. 7A is a cross-sectional view illustrating a portion of a semiconductor device according to a reference example.

FIG. 7A is a cross-sectional view illustrating a portion of a semiconductor device according to a reference example. FIG. 7B is a cross-sectional view illustrating a portion of the semiconductor device according to the first embodiment.

In the semiconductor device 100r according to the reference example, the lower surface of the gate electrode 40 is parallel to the X-direction and the Y-direction. The length in the Z-direction of the gate electrode 40 is uniform in the X-direction and the Y-direction. The other components of the semiconductor device 100r according to the reference example are similar to those of the semiconductor device 100.

When a current flows through the n⁻-type drift region 1, the electrical resistance between the insulating portions 10 is higher than in the other portions (the portions lower than the insulating portion 10). This is because the current path between the insulating portions 10 is narrow compared to the other portions. To reduce the ON-resistance of the semiconductor device 100, it is desirable for the lower end of the insulating portion 10 to be positioned higher.

In the semiconductor device 100 according to the first embodiment, the gate electrode 40 includes the first portion 41 and the second portion 42. The first portion 41 is positioned on the conductive portion 30. The lower surface of the first portion 41 is positioned higher than the lower end of the interface between the p-type base region 2 and the n⁺-type source region 3. The lower surface of the second portion 42 is positioned lower than the interface between the n⁻-type drift region 1 and the p-type base region 2.

It is possible to provide the conductive portion 30 higher by the amount that the lower surface of the first portion 41 is positioned higher with respect to the lower surface of the second portion 42. As a result, it can be seen from comparing FIG. 7A and FIG. 7B that the lower end of the insulating portion 10 can be positioned higher compared to that of the semiconductor device 100r according to the reference example. Accordingly, the lower end of the insulating portion 10 can be positioned higher.

Further, according to the first embodiment, the distance in the Z-direction between the upper end of the conductive portion 30 and the lower end of the gate electrode 40 (the lower end of the second portion 42) can be shorter. In other words, the distance is the dimension in the Z-direction of the gap between the conductive portion 30 and the gate electrode 40 when the conductive portion 30 and the gate electrode 40 are viewed along the X-direction. For example, according to the first embodiment, the upper end of the conductive portion 30 and the lower end of the gate electrode 40 are arranged in the X-direction with the first insulating portion 10 interposed; and the gap recited above can be eliminated.

Generally, at the breakdown voltage of the semiconductor device 100, a larger electric field is generated at the interface between the n⁻-type drift region 1 and the p-type base region 2 than at the lower end vicinity of the first insulating portion 10. By reducing the gap recited above, the decrease of the potential between the conductive portion 30 and the gate electrode 40 in the potential distribution of the semiconductor device 100 interior at the breakdown voltage can be small. When the decrease of the potential between the conductive portion 30 and the gate electrode 40 is smaller, the potential at the first insulating portion 10 lower end vicinity increases and the electric field intensity increases commensurately. When the electric field intensity at the first insulating portion 10 lower end vicinity increases, the electric field intensity that is applied to the interface between the n⁻-type drift region 1 and the p-type base region 2 decreases.

Thereby, the breakdown voltage of the semiconductor device 100 can be increased.

In other words, according to the first embodiment, the ON-resistance of the semiconductor device 100 can be reduced while increasing the breakdown voltage of the semiconductor device 100.

Desirable structures of the semiconductor device 100 will now be described in detail.

FIG. 8A, FIG. 8B, FIG. 9A, and FIG. 9B are cross-sectional views illustrating a portion of the semiconductor device according to the first embodiment.

Figure 8A:
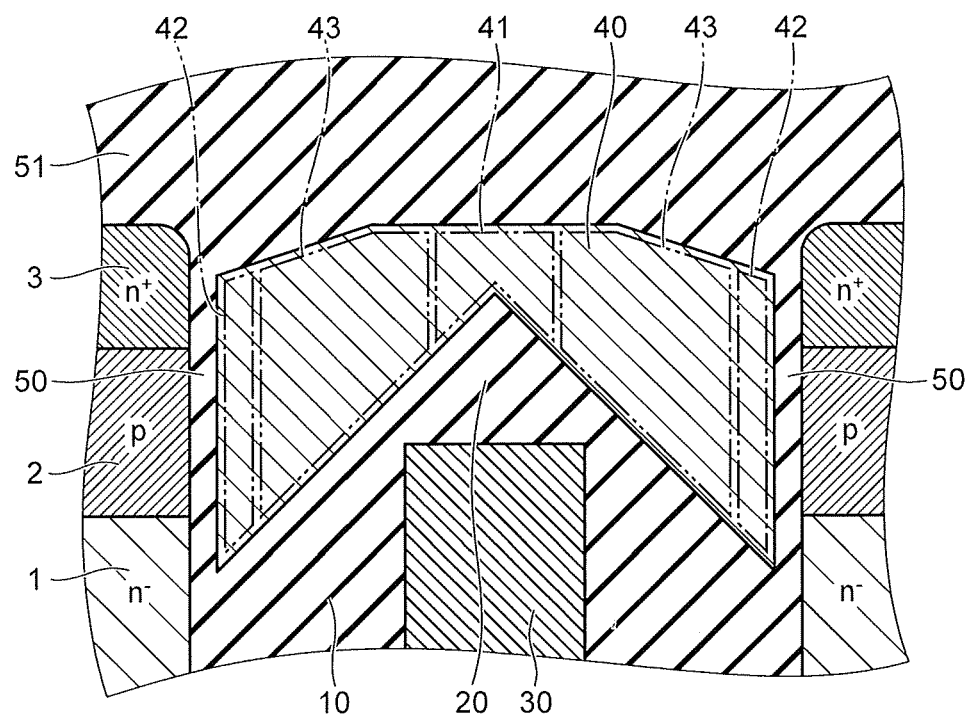
FIG. 8A, FIG. 8B, FIG. 9A, and FIG. 9B are cross-sectional views illustrating a portion of the semiconductor device according to the first embodiment.

For example, as illustrated in FIG. 8A, the upper surface of the conductive portion 30 may be positioned higher than the interface between the n⁻-type drift region 1 and the p-type base region 2. According to this structure, the lower ends of the conductive portion 30 and the insulating portion 10 can be positioned higher. As a result, the ON-resistance of the semiconductor device 100 can be reduced further.

Figure 8B:
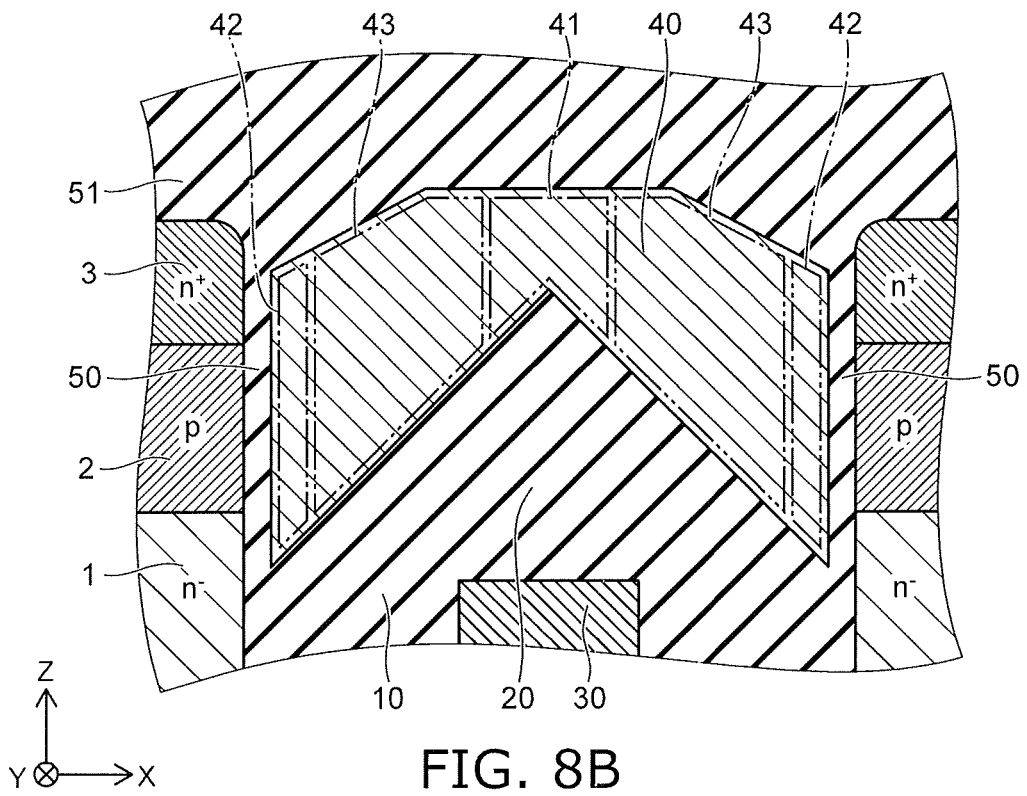

Or, as illustrated in FIG. 8B, the upper surface of the conductive portion 30 may be positioned lower than the interface between the n⁻-type drift region 1 and the p-type base region 2. According to this structure, the distance between the conductive portion 30 and the gate electrode 40 can be long. Therefore, when the voltage is applied to the gate electrode 40, the electric field intensity between the conductive portion 30 and the gate electrode 40 can be reduced; and the occurrence of the dielectric breakdown of the insulating portion 20 can be suppressed.

The insulating portion 20 includes an impurity such as phosphorus, boron, etc. The impurity concentration in the insulating portion 20 is higher than the impurity concentration in the insulating portion 10 and higher than the impurity concentration in the gate insulating portion 50.

For example, as illustrated in FIG. 8A and FIG. 8B, the upper surface of the gate electrode 40 is provided in an upward convex configuration. In other words, the upper surface of the first portion 41 is positioned higher than the upper surface of the second portion 42. It is desirable for the upper surface of the first portion 41 to be positioned higher than the upper surface of the n⁺-type source region 3 as illustrated in FIG. 8B. According to this structure, the length in the Z-direction of the first portion 41 can be longer. The electrical resistance of the gate electrode 40 decreases as the length in the Z-direction of the first portion 41 increases. Thereby, a delay when changing the potential of the gate electrode 40 can be suppressed.

Figure 9A:
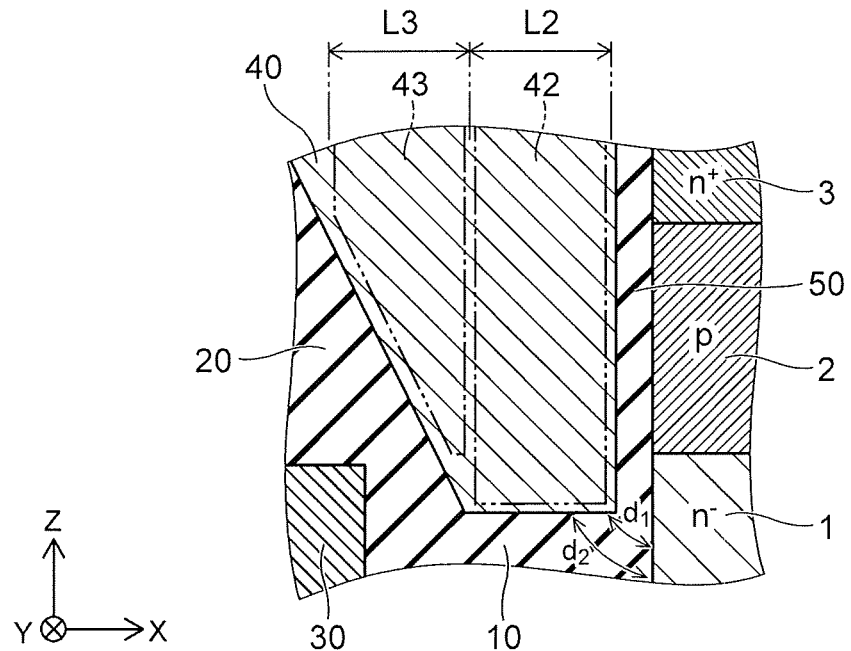
Figure 9B:
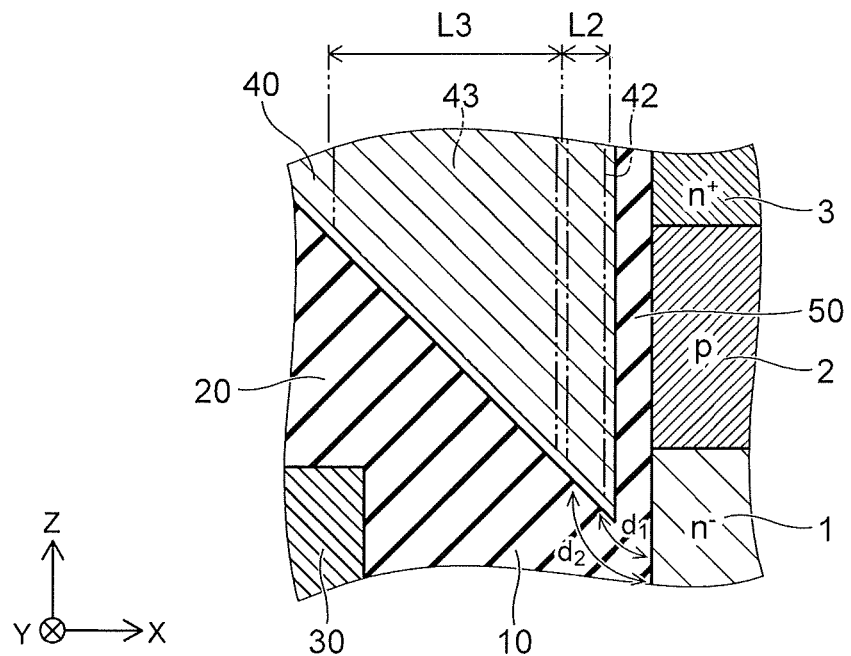

The lower surface of the second portion 42 may be parallel to the X-direction and the Y-direction as illustrated in FIG. 9A or may be tilted upward from the second portion 42 toward the first portion 41 as illustrated in FIG. 9B.

In the case where the lower surface of the second portion 42 is tilted upward as illustrated in FIG. 9B, compared to the structure illustrated in FIG. 9A, the distances (e.g., a distance $d_1$ and a distance $d_2$) between the n⁻-type drift region 1 and points on the lower surface of the second portion 42 can be longer. Thereby, a capacitance $C_{GD}$ between the n⁻-type drift region 1 (the drain electrode 61) and the gate electrode 40 can be small. As a result, the switching time of the semiconductor device 100 can be shortened; and the switching loss of the semiconductor device 100 can be reduced.

As illustrated in FIG. 2, it is desirable for a length L2 in the X-direction of the second portion 42 to be shorter than a length L1 in the X-direction of the first portion 41 and shorter than a length L3 in the X-direction of the third portion 43. According to this structure, fewer portions of the gate electrode 40 have long lengths in the Z-direction; and the volume of the gate electrode 40 can be small. Thereby, when forming the gate electrode 40, less conductive material is necessary to fill the trenches T; and the trenches T can be filled easily. As a result, for example, it is unnecessary to perform a two-stage film formation of the conductive material for filling the trenches T, surface polishing after the conductive material is formed, etc.; and the number of processes necessary for manufacturing the semiconductor device 100 can be reduced.

Modification

Figure 10:
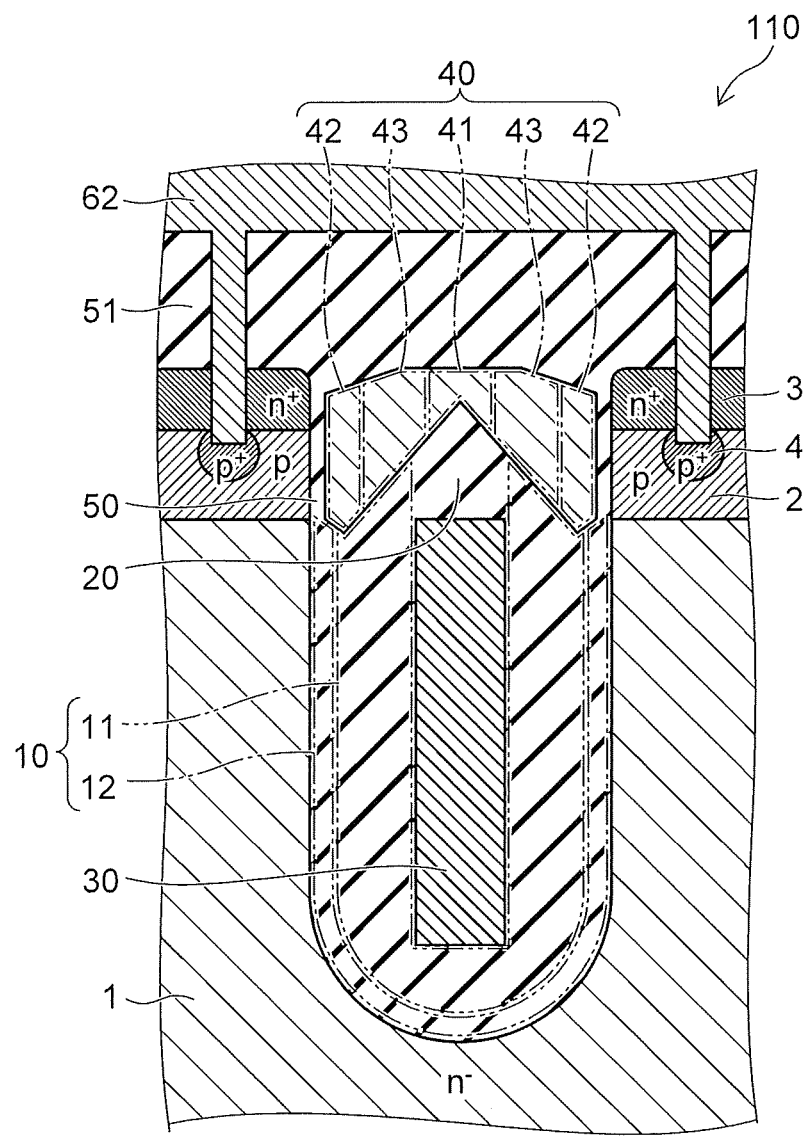
FIG. 10 is a cross-sectional view illustrating a semiconductor device according to a modification of the first embodiment.

FIG. 10 is a cross-sectional view illustrating a semiconductor device according to a modification of the first embodiment.

The configuration of the second portion 42 of the gate electrode 40 of the semiconductor device 110 illustrated in FIG. is different from that of the semiconductor device 100 illustrated in FIG. 1 and FIG. 2.

In the semiconductor device 100 illustrated in FIG. 1 and FIG. 2, the lower surface of the second portion 42 is tilted uniformly upward from the second portion 42 toward the first portion 41. In the semiconductor device 110, a portion of the lower surface of the second portion 42 is tilted downward from the second portion 42 toward the first portion 41. Another portion of the lower surface of the second portion 42 is tilted upward from the second portion 42 toward the first portion 41 on the first portion 41 side of the portion of the lower surface of the second portion 42.

For example, in the semiconductor device 100 illustrated in FIG. 1 and FIG. 2, the length in the Z-direction of the second portion 42 has a maximum at a position contacting the gate insulating portion 50. In the semiconductor device 110, the length in the Z-direction of the second portion 42 has a maximum at a position separated from the gate insulating portion 50.

A potential difference occurs between the n⁻-type drift region 1 and the gate electrode 40 in a state in which a voltage is applied to the drain electrode 61 but a voltage is not applied to the gate electrode 40. In the case where the lower surface of the second portion 42 is tilted upward uniformly as in the semiconductor device 100, the angle between the side surface and the lower surface of the second portion 42 is small; and the curvature at the portion between the side surface and the lower surface is large. Thereby, there is a possibility that electric field concentration may occur at the portion vicinity; and dielectric breakdown may occur.

In the semiconductor device 110, a portion of the lower surface of the second portion 42 is tilted downward in the direction from the second portion 42 toward the first portion 41. Another portion of the lower surface of the second portion 42 is tilted upward in the direction from the second portion 42 toward the first portion 41. According to this configuration, the curvature at the portion between the side surface and the lower surface of the second portion 42 can be small. Thereby, the electric field concentration at the portion vicinity can be relaxed; and the occurrence of the dielectric breakdown can be suppressed.

In the semiconductor device 110, the insulating portion 10 includes a first region 11 and a second region 12. The first region 11 is provided around the conductive portion 30 and contacts the conductive portion 30. The second region 12 is provided between the n$^-$-type drift region 1 and the first region 11 and contacts the n$^-$-type drift region 1.

The second region 12 includes boron. The first region may include boron or may not include boron. The concentration of boron in the second region 12 is higher than the concentration of boron in the first region 11. When manufacturing the semiconductor device 110, in the case where the second region 12 includes boron, the boron diffuses from the second region 12 to the n$^-$-type drift region 1 in the heat treatment. Thereby, the effective n-type impurity concentration at the second region 12 vicinity of the n$^-$-type drift region 1 decreases. Thereby, the depletion rate at the second region 12 vicinity of the n$^-$-type drift region 1 increases; and a capacitance $C_{DS}$ between the n$^-$-type drift region 1 (the drain electrode 61) and the conductive portion 30 (the source electrode 62) can be small.

FIG. 11A to FIG. 12B are process cross-sectional views illustrating a method for manufacturing the semiconductor device according to the modification of the first embodiment.

Figure 11A:
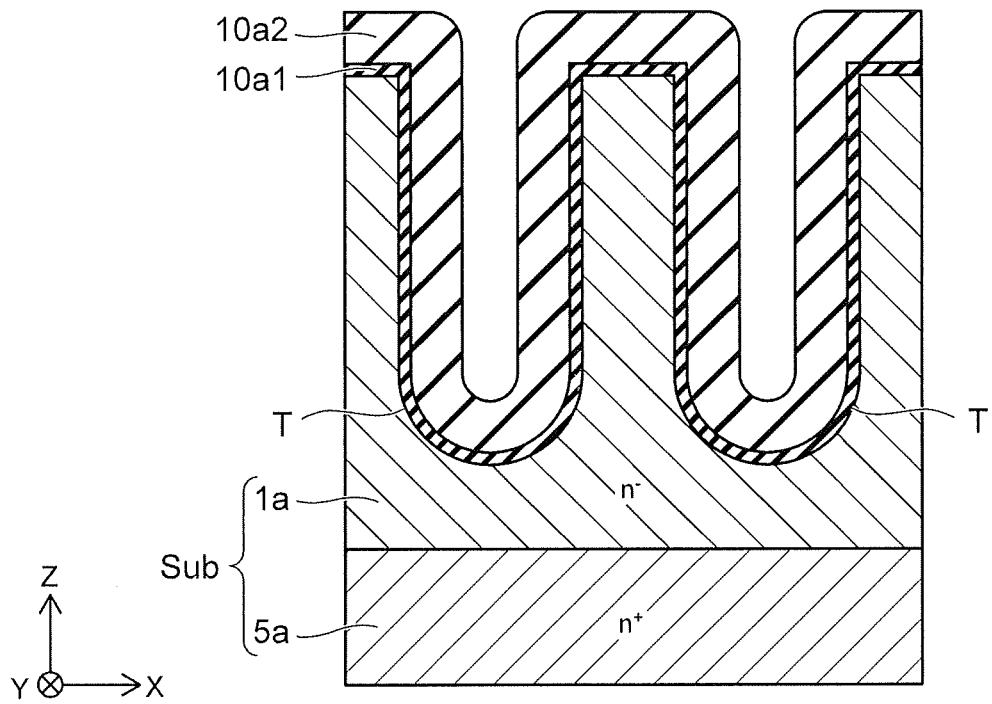
FIG. 11A to FIG. 12B are process cross-sectional views illustrating a method for manufacturing the semiconductor device according to the modification of the first embodiment.

First, the multiple trenches T are formed in the upper surface of the substrate Sub similarly to the method for manufacturing the semiconductor device described above. An insulating layer 10a1 is formed along the upper surface of the n$^-$-type semiconductor region 1a and the inner surfaces of the trenches T. As illustrated in FIG. 11A, an insulating layer 10a2 is formed along the surface of the insulating layer 10a1. For example, the insulating layer 10a1 is thinner than the insulating layer 10a2.

The insulating layer 10a1 is formed by depositing BSG (Boron Silicate Glass) by CVD. The insulating layer 10a2 is formed by depositing silicon oxide by CVD without adding an impurity.

Figure 11B:
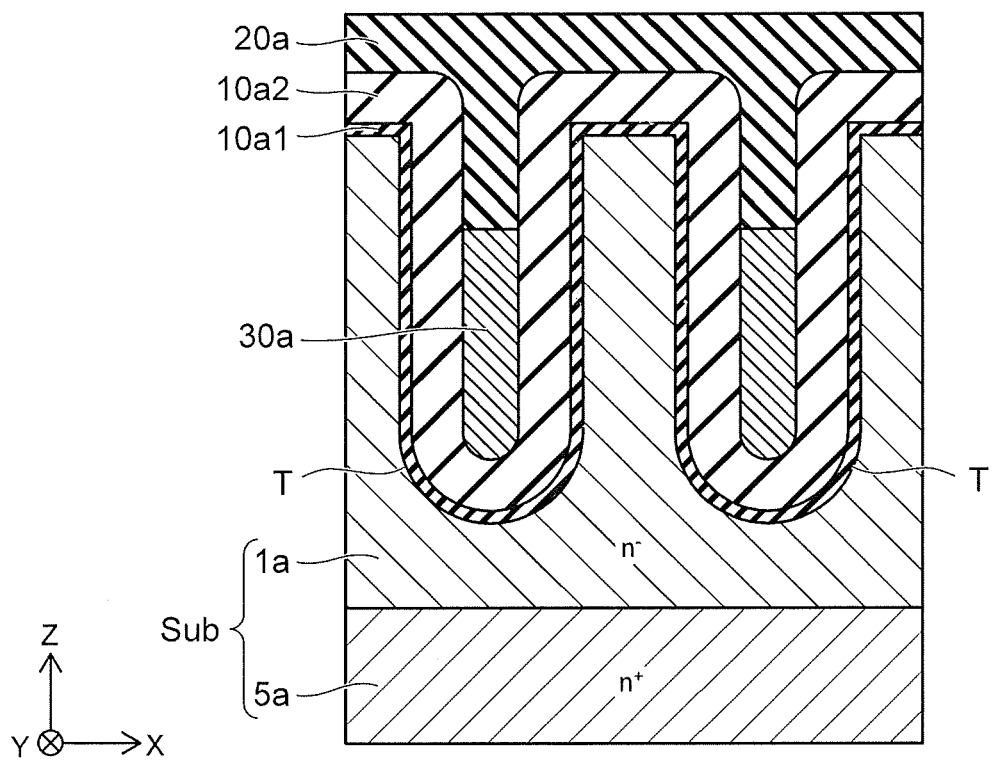
Figure 12A:
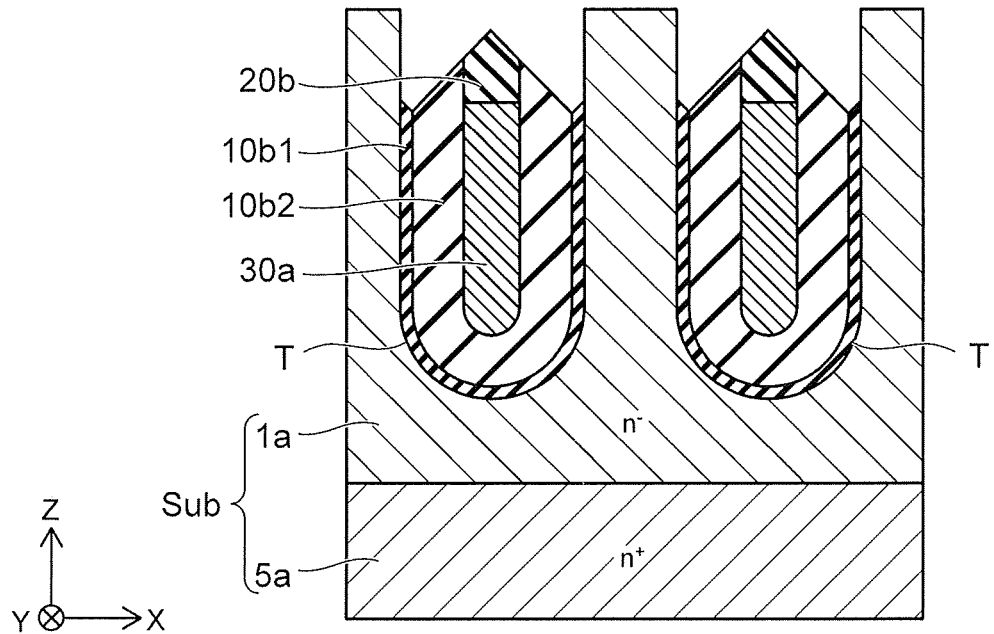

Processes similar to the processes illustrated in FIG. 3B and FIG. 4A are performed; and the multiple conductive layers 30a and the insulating layer 20a are formed as illustrated in FIG. 11B. Subsequently, portions of the insulating layer 10al, the insulating layer 10a2, and the insulating layer 20a are removed by wet etching. Thereby, as illustrated in FIG. 12A, multiple insulating layers 10b1, multiple insulating layers 10b2, and the multiple insulating layers 20b that are provided to be separated from each other are formed inside the multiple trenches T.

The chemical liquid of the wet etching is selected so that the etching rate of the insulating layer 10a2 is larger than the etching rate of the insulating layer 10a1 and larger than the etching rate of the insulating layer 20a. Similarly to the process illustrated in FIG. 4B, a mixed liquid of ammonium hydrogen fluoride (NH$_4$HF$_2$) and acetic acid (CH$_3$COOH), a mixed liquid of dilute hydrofluoric acid (HF) and ammonium fluoride (NH$_4$F), or the like can be used as the chemical liquid of the wet etching.

As a result, the upper surfaces of the insulating layer 10b1 are respectively tilted downward from the side walls of the trench T toward the insulating layer 20b. The upper surfaces of the insulating layer 10b2 are respectively tilted downward from the insulating layer 20b toward the side walls of the trench T. A part of the upper surface of the insulating layer 20b is tilted downward from the insulating layer 20b toward one sidewall of the trench T. Another part of the upper surface of the insulating layer 20b is tilted downward from the insulating layer 20b toward the other sidewall of the trench T. A central portion of the upper surface of the insulating layer 20b in the X direction is located above the part of the upper surface of the insulating layer 20b and the other part of the upper surface of the insulating layer 20b.

Figure 12B:
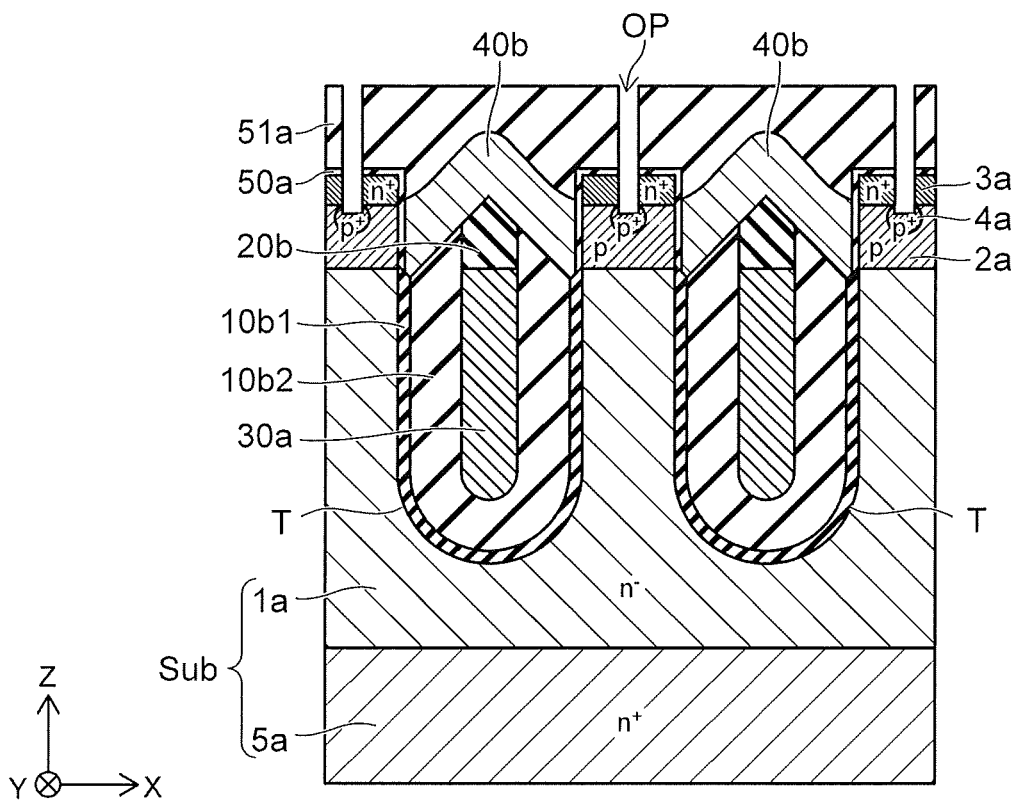

Processes similar to the processes illustrated in FIG. 5A, FIG. 5B, and FIG. 6A are performed; and the structure illustrated in FIG. 12B is obtained. Subsequently, the semiconductor device 110 that has the structure of the gate electrode 40 illustrated in FIG. 10 is manufactured by performing a process similar to the process illustrated in FIG. 6B.

The embodiments described above are applicable not only to MOSFETs but also to IGBTs.

Second Embodiment

Figure 13:
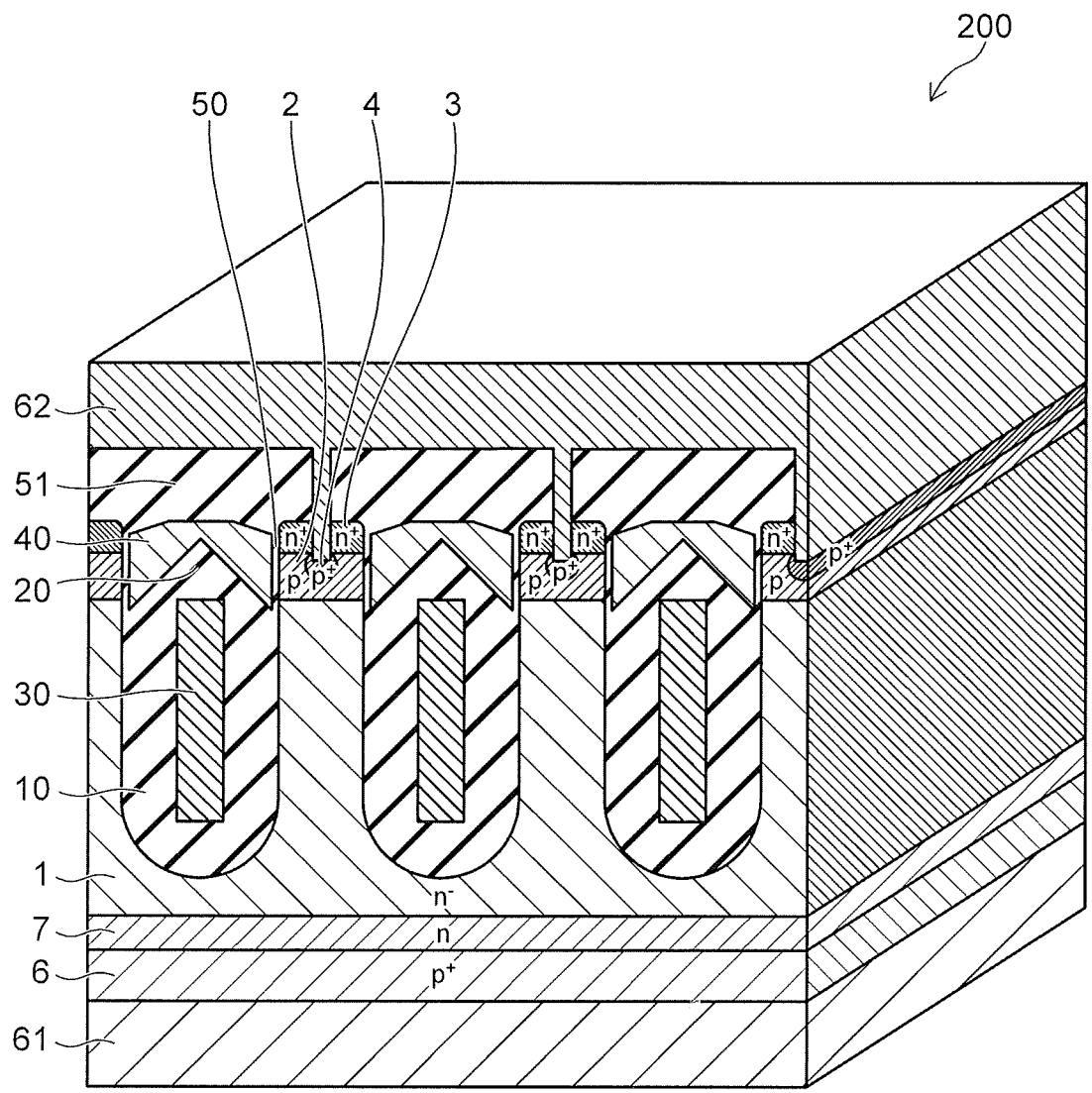
FIG. 13 is a perspective cross-sectional view illustrating a semiconductor device according to a second embodiment.

FIG. 13 is a perspective cross-sectional view illustrating a semiconductor device according to a second embodiment.

The semiconductor device 200 according to the second embodiment illustrated in FIG. 13 is an IGBT. The semiconductor device 200 includes a p$^+$-type collector region 6 and an n-type buffer region 7 instead of the n$^+$-type drain region 5. In the semiconductor device 200, the drain electrode and the source electrode 62 function respectively as a collector electrode and an emitter electrode.

The p$^+$-type collector region 6 is provided on the collector electrode 61 and is electrically connected to the collector electrode 61. The n-type buffer region 7 is provided on the p$^+$-type collector region 6. The n$^-$-type drift region 1 is provided on the n-type buffer region 7.

According to the second embodiment, similarly to the first embodiment, the lower end of the insulating portion 10 can be positioned higher because the gate electrode 40 includes the first portion 41. Therefore, the ON-resistance can be reduced while increasing the breakdown voltage of the semiconductor device 200. The other features described for the first embodiment also are applicable to the semiconductor device 200 according to the second embodiment.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
 a first electrode;
 a first semiconductor region provided on the first electrode, the first semiconductor region being of a first conductivity type and being electrically connected to the first electrode;
 a second semiconductor region provided on the first semiconductor region, the second semiconductor region being of a second conductivity type;
 a third semiconductor region provided selectively on the second semiconductor region, the third semiconductor region being of the first conductivity type;
 a conductive portion provided inside the first semiconductor region with a first insulating portion interposed;
 a gate electrode separated from the conductive portion in a first direction, the first direction being from the first electrode toward the first semiconductor region,
  the gate electrode including a first portion provided on the conductive portion with a second insulating portion interposed, a lower surface of the first portion being positioned higher than a lower end of an interface between the second semiconductor region and the third semiconductor region,
  the gate electrode including a second portion opposing, with a gate insulating portion interposed, the first semiconductor region, the second semiconductor region, and the third semiconductor region in a second direction perpendicular to the first direction,
  a position in the second direction of the second portion being between a position in the second direction of the first portion and a position in the second direction of the second semiconductor region; and
 a second electrode provided on the second semiconductor region and the third semiconductor region and electrically connected to the conductive portion, the second semiconductor region, and the third semiconductor region.

2. The device according to claim 1, wherein an upper surface of the conductive portion is positioned higher than an interface between the first semiconductor region and the second semiconductor region.

3. The device according to claim 1, wherein an upper surface of the gate electrode is provided in a convex configuration toward the first direction.

4. The device according to claim 1, wherein an upper surface of the first portion is positioned higher than an upper surface of the third semiconductor region.

5. The device according to claim 1, wherein a lower surface of the second portion is tilted upward from the second portion toward the first portion.

6. The device according to claim 1, wherein the gate electrode further includes a third portion,
 a position in the second direction of the third portion is between the position in the second direction of the first portion and the position in the second direction of the second portion,
 a lower surface of the third portion is positioned higher than an interface between the first semiconductor region and the second semiconductor region and positioned lower than the lower end of the interface between the second semiconductor region and the third semiconductor region, and
 a length in the second direction of the second portion is shorter than a length in the second direction of the first portion and shorter than a length in the second direction of the third portion.

7. The device according to claim 1, wherein
 a portion of a lower surface of the second portion is tilted downward from the second portion toward the first portion, and
 another portion of the lower surface of the second portion is positioned on the first portion side of the portion of the lower surface of the second portion and is tilted upward from the second portion toward the first portion.

* * * * *